United States Patent
Harris et al.

[11] Patent Number: 5,654,208
[45] Date of Patent: Aug. 5, 1997

[54] METHOD FOR PRODUCING A SEMICONDUCTOR DEVICE HAVING A SEMICONDUCTOR LAYER OF SiC COMPRISING A MASKING STEP

[75] Inventors: Christopher Harris, Sollentuna; Andrei Konstantinov, Linköping; Erik Janzen, Borensberg, all of Sweden

[73] Assignee: ABB Research Ltd., Zurich, Sweden

[21] Appl. No.: 436,487

[22] Filed: May 8, 1995

[30] Foreign Application Priority Data

Apr. 10, 1995 [SE] Sweden .................................. 9501312

[51] Int. Cl.$^6$ .................................................. H01L 21/265
[52] U.S. Cl. .................... 438/522; 438/140; 438/542; 438/931; 438/945; 148/DIG. 126
[58] Field of Search ........................... 437/22, 40–41, 437/141, 70; 148/DIG. 126

[56] References Cited

U.S. PATENT DOCUMENTS

| | | |
|---|---|---|
| 4,030,942 | 6/1977 | Keenan et al. . |
| 4,058,413 | 11/1977 | Welch et al. . |
| 5,322,802 | 6/1994 | Baliga et al. ........................ 437/22 |
| 5,401,686 | 3/1995 | Kiyose . |
| 5,510,281 | 4/1996 | Ghezzo et al. ........................ 437/41 |
| 5,510,632 | 4/1996 | Brown et al. ........................ 257/77 |

FOREIGN PATENT DOCUMENTS

| | | |
|---|---|---|
| 0380340 | 8/1990 | European Pat. Off. . |
| 2707425 | 7/1993 | France . |

OTHER PUBLICATIONS

Campbell et al., Electrical Properties of SiC Devices, in Mat. Res. Bull. vol. 4, pp. S 211–S 222, 1969, month unknown.

*Primary Examiner*—John Niebling
*Assistant Examiner*—Richard A. Booth
*Attorney, Agent, or Firm*—Pollock, Vande Sande & Priddy

[57] ABSTRACT

The present invention relates to a method for producing a semiconductor device having a semiconductor layer of SiC. The method comprises the steps of a) applying a mask on at least a portion of the SiC layer to coat a first portion of the SiC layer leaving a second portion thereof uncoated, b) applying a heat treatment to the SiC layer, and c) supplying dopants to the SiC layer during the heat treatment for diffusion of the dopants into the SiC layer at the second portion thereof for doping the SiC layer. The mask is made of crystalline AlN as the only component or AlN as a major component of a crystalline alloy constituting the material.

12 Claims, 1 Drawing Sheet

METHOD FOR PRODUCING A SEMICONDUCTOR DEVICE HAVING A SEMICONDUCTOR LAYER OF SIC COMPRISING A MASKING STEP

TECHNICAL FIELD OF THE INVENTION

The present invention relates to a method for producing a semiconductor device having a semiconductor layer of SiC, the method comprising at least the steps of a) application of a mask on at least a portion of said SiC layer and b) heat treatment of the SiC layer.

BACKGROUND OF THE INVENTION

The production of all types of semiconductor devices is comprised, for example of different types of diodes, transistors and thyristors.

Such devices are particularly used in applications in which it is possible to benefit from the superior properties of SiC in comparison with Si, namely the capability of SiC to function well under extreme conditions. SiC has a high thermal stability due to a large bandgap energy, so that devices fabricated from that material are able to operate at high temperatures, namely up to 1000° K. Furthermore, it has a high thermal conductivity, so that SiC devices can dissipate high power without overheating. SiC also has more than five times higher breakdown field than Si, so that it is well suited for use in high power devices operating under conditions where high voltages may occur in the blocking state of a device.

The heat treatment in the semiconductor device production method mentioned in the introduction may be, for example, the heating of the SiC layer for obtaining a diffusion of dopants therein or an annealing after ion implantation in the SiC layer so as to activate the dopants implanted. Due to the character of SiC such a heat treatment has to be carried out at comparatively high temperatures, mostly above 1500° C., which makes it impossible to use traditional mask materials, such as $SiO_2$ or $Si_3N_4$, as used for Si, inter alia for diffusion in Si.

A possible mask material for producing semiconductor devices having a semiconductor layer of SiC can be obtained by using the so-called self-making technique, namely by employing SiC itself as a mask. In the diffusion case, this means that the region which should be masked from diffusion is covered with a sufficiently thick SiC layer, so that the diffusion front may not reach the device region which must be protected from diffusion. The disadvantage of the self-masking technique is the requirement of obtaining a thick masking layer on the crystal surface. In fact, the thickness of the masking layer of SiC cannot be lower than the dopant diffusion depth, provided the diffusion coefficient is the same in the region where the diffusion is obtained, and in the masking layer of SiC, so that the self-masking technique is not a really planar, technique. Besides, the planar or nearly planar, geometry is highly desirable from the viewpoint of device technology, because device patterning, etching and metallization can be performed much more accurately on a flat wafer surface. Furthermore, the self-masking technique involves lapping and polishing on a flat polisher to remove the masking layer of SiC which has been found to severely deteriorate the device performance due to mechanical damages which penetrate into the crystal bulk. In particular, dealing with the application of the diffusion technique for fabrication of diffused guard rings in SiC power devices turns out to be impractical, because of the deep dopant penetration required for these guard rings. Thickness of the masking SiC layers consequently turns out to be unreasonably high.

SUMMARY OF THE INVENTION

The object of the present invention is therefore to find a remedy to the problems mentioned above and to provide a method for producing a semiconductor device having a semiconductor layer of SiC in which the masking may be carried out in a way which makes it possible to produce high quality semiconductor devices, especially high-voltage power devices.

This object is in accordance with the invention, obtained by using a method referred to in the introduction in which a mask made of a material having crystalline AlN as the only component or AlN as a major component, of a crystalline alloy constituting the material, is applied on the layer portion before the heat treatment.

AlN has a very good lattice match with SiC with a misfit of only 0,7%. It has nearly the same coefficient of thermal expansion as SiC, and it is stable at the high temperatures (up to 2200° C.) used when heat treatment of SiC layers takes place during the production of semiconductor devices. Due to the lattice match, high quality AlN layers may be grown on SiC to produce a mask, which can be patterned, if desired, for diffusion of dopants into the SiC layer. The good lattice match of AlN to SiC is important in preventing enhanced diffusion along the interface via defects, and from the surface through defects during the heat treatment of the SiC layer. Some other compounds, like the other group 3B-nitrides and silicon carbide itself may be added in minor amounts to AlN for forming a mask of a crystalline alloy constituting the material, although such group 3B-nitrides have considerably inferior lattice matching and a much higher decomposition rate at elevated temperatures than AlN. However, the addition of such minor amounts of the compounds to the masking material may be desirable, for example, from the viewpoint of the deposition process convenience and, on the other hand, this will not deteriorate the masking properties or high temperature stability of the masking material. Another advantage of using AlN as mask material is that it has good blocking tolerance for diffusion, especially for diffusion of boron, which probably is the most interesting dopant to introduce into the SiC layer by diffusion due to the high diffusitivity of boron in SiC at elevated temperatures. This is explained by the fact that boron is an isoelectronic impurity in AlN, so that the reaction between boron and nitrogen results in boron nitride, a refractory compound chemically close to AlN. Intermixing of BN and AlN is very slow at any temperature below the melting point.

According to a preferred embodiment of the invention concerning a method for producing a suitable junction termination technique for a semiconductor power device, a mask is, through step a) and a possible following step, applied only to coat a first portion of the SiC layer, leaving a second portion thereof uncoated. The dopants are supplied to the SiC layer during the heat treatment for diffusion of the dopants into the SiC layer at the second portion for doping the SiC layer. The peripheral regions of the SiC layer are left uncoated through the mask for obtaining diffusion of dopants at the periphery thereof. The heat treatment, and thereby the diffusion, is carried out under such conditions that the dopants may penetrate through a junction to create a graded pn-interface of the device for creating a guard ring arranged to smooth out the electric field in the peripheral region in the blocking state of the power device so created.

Thus, the use of a mask according to the invention makes it possible to form guard rings for smoothing out the electric field in the peripheral region in the blocking state of a power device having a SiC layer, so that the electric field at the periphery can remain well below the breakdown threshold. This usage of the guard ring technique for device termination has not been used for silicon power devices, because they are so thick that it is technically difficult to diffuse the dopants deep enough. However, silicon carbide power devices have a considerably lower base thickness due to the high breakdown fields of SiC, and the guard ring technique may therefor be suitable for such power devices.

According to another preferred embodiment of the invention the method comprises a step used in conjugation with ion implantation in a portion of the SiC layer not coated by the mask, the step being carried out before the heat treatment is carried out, and the heat treatment constituting an annealing to recrystallized the ion-implanted layer of the SiC layer, the mask preventing impurity diffusion into areas covered thereby from occurring. Such annealing takes place at high temperatures, well above 1500° C., and the mask efficiently prevents impurity diffusion into areas covered thereby from occurring because of the possibility of growing high quality AlN layers on SiC and the stability and the blocking tolerance for diffusion of AlN.

According to a further preferred embodiment of the invention, the method according to the two embodiments last described comprises the step of ion implantation in the peripheral region of the SiC layer, in which ions of the same type (P or N), as the dopants to be diffused into the SiC layer are implanted while creating a thin highly doped layer close to the surface of the SiC layer. Then a first annealing heat treatment, and then a heat treatment, combined with a supply of dopants for guard ring formation, is carried out, the diffusion for the guard ring formation being enhanced by the existence of the highly doped thin layer. This means that the method including the application of a mask makes it possible to create guard rings for SiC power devices while using the ability thereof to function as a mask for annealing heat treatment as well as diffusion heat treatment.

The production steps referred to in the claims are only some of a great number of production steps which are well established the technique of semiconductor device fabrication, such as the application of ohmic contacts, patterning or removal of the mask by, for example, reactive ion etching, etc. Thus, "the application of a mask on at least a portion of the SiC layer" does not normally mean that the mask is, in one step, applied on a portion of the SiC layer, but the mask may be first applied onto the entire SiC layer and then removed by a suitable technique from parts of the SiC layer leaving it on the portion.

Further advantages and preferred features of the invention will appear from the following description and the other claims.

BRIEF DESCRIPTION OF THE DRAWING

With reference to the appended drawing, below follows a specific description of a preferred embodiment of the invention cited as an example.

In the drawing.

DETAILED DESCRIPTION OF A PREFERRED EMBODIMENT OF THE INVENTION

Figure 1:
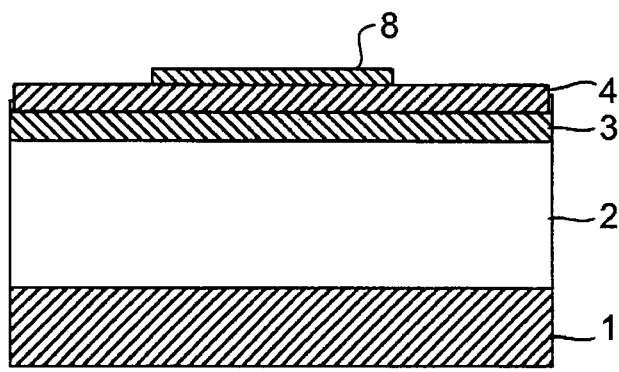
FIGS. 1–5 illustrate schematically different steps of a method for producing a semiconductor power device in the form of a rectifier diode of SiC according to a preferred embodiment of the invention.

FIGS. 1–5 illustrate a few important steps of a large number of steps of a method according to the invention for producing a power diode made of SiC by using planar-diffusion technology. All the layers of the device are made of SiC, but hetero-junction devices are also within the scope of the invention. The device has three differently doped layers, namely a third highly doped layer 1 of N-type to make low-resistance contact with an ohmic contact metal plate of the device (not—and change "figures," to—drawings), shown in the drawings, a second low-doped N-type thicker layer 2 arranged thereon, and a first thinner P-type layer 3 arranged on top of the second layer 2 and forming a pn-junction at the interface therewith. In a rectifier diode having these three layers, the space charge region is primarily provided by the second low-doped layer, which takes the main part of the voltage applied on the device in the reverse operating direction, and such a device may have a breakdown voltage in the kV-range. However, the breakdown voltage will be lower in the peripheral region of the device than in the bulk thereof due to electric field concentration, surface defects, and the risks of spark formation and the like, so that different passivation techniques are necessary. A serious problem with the peripheral breakdown is due to its localized nature, since it only occurs at a single point at the periphery and therefore results in a very high current density and specific power dissipation. This may lead to an irreversible device degradation even in the case of a rather low reverse current. Accordingly, it is preferred that in the event of a breakdown, this would occur uniformly over the diode area so that the current density will be very low, and the flow of a high reverse current will not deteriorate the device parameters. Thus, it is highly desirable to remove the weak spots of the diode, since this not only increases the operation voltage but also make it unnecessary to provide circuitry for preventing the rectifier from overloading. Accordingly, it is preferred that a possible breakdown should occur first in the bulk instead of near the periphery.

The method for producing a semiconductor device to be described now deals with this problem. The method comprises the step of deposition of a crystalline AlN layer 4 on top of the P-type SiC sub-layer 3. It is possible to epitaxially grow such a crystalline AlN layer with very high quality on the SiC layer, since the lattice match of crystalline AlN and crystalline SiC is very good, which results in a very high quality at the interface between the layers 3 and 4 with a very low concentration of defects.

Figure 2:
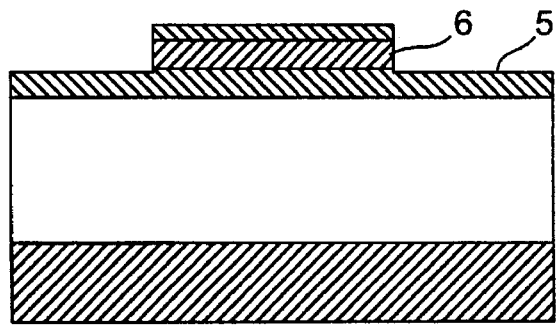
Figure 3:
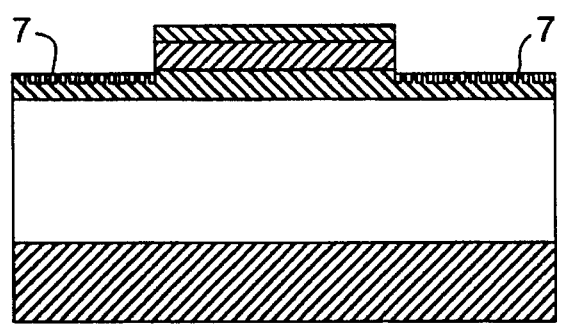
Figure 4:
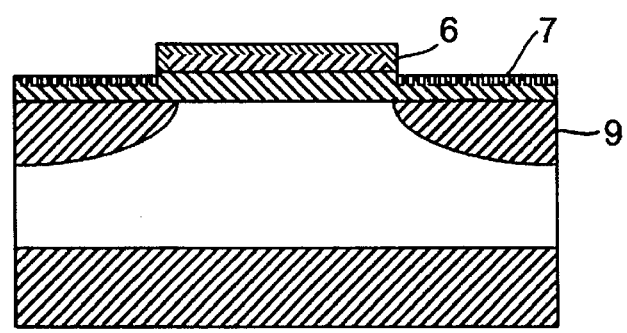

Removal of the AlN layer 4 in the selected areas to be doped is then carried out by reactive ion etching (RIE) in the peripheral regions 5 as shown in FIG. 2. It is thereby important that a portion of the P-type first layer 3 be retained in these peripheral regions 5. Accordingly, a patterned mask 6 is now obtained.

In the next step, a p-type layer 7, heavily doped with aluminium, is applied on top of the regions subject to boron diffusion (discussed below) to enhance boron penetration. Such a layer is prepared, for example, by Al ion implantation with an energy of 50–100 KeV and a dose 2–3 $10^{16}$ cm$^{-3}$ which gives a layer thickness in the region 0.05–0.2μm. The layer is initially amorphized as implanted however, the high temperature treatment in the course of boron diffusion results in its recrystallization. An amount of Al diffusion into the crystal actually occurs however the diffusivity of Al in SiC is very low and the main effect of the Al-doped layer is the enhancement of boron diffusion. It is clear that a thin layer heavily doped with Al can as well be prepared by other techniques, for example by epitaxial growth; however, the ion implantation in such a case seems to provide the easiest solution from the viewpoint of technical complexity.

In the next step, boron is supplied to the surface of the SiC layer while heating the SiC layer to 1600°–1750° C. It has been found that boron has a reasonably high diffusivity in SiC at these temperatures, and the thin highly-doped P-type layer 7 will enhance the diffusion of boron in the peripheral regions 5 of the SiC layer; whereas the AlN layer will efficiently block diffusion of boron thereinto and accordingly into the central active region of the semiconductor layers 2 and 3. Thus, a suitable choice of the diffusion regimes (temperature, diffusion time, supply rate of boron) provides a sufficiently thick compensated layer 9 in the form of a guard ring in the peripheral region of the wafer and the penetration of boron through the mask 6 is prevented. The guard rings thus obtained extend the pn-junction of the device thus created in the peripheral regions thereof, so that the electric field in the peripheral region is smoothed out in a blocking state of such a power device, preventing a possible breakdown from occurring firstly at the periphery of the device.

Figure 5:
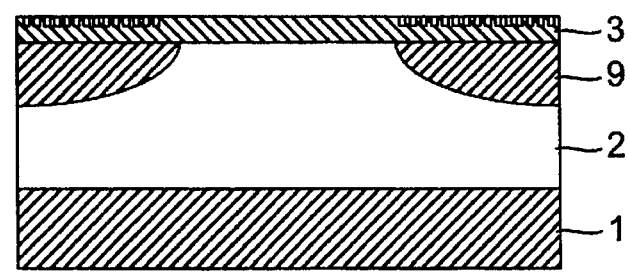

Finally, FIG. 5 shows how the structure has been etched by RIE to remove the AlN layer 4 from the active region and to define the diode area. Thereafter several steps of the usual sequence of device termination follow, such as oxidation or deposition of a dielectric, contact metal deposition, and so on. The real method for producing the power rectifier diode of course involves numerous additional steps, which may be performed in a conventional way, and only the steps of importance for the invention have been described above.

In another preferred embodiment, the boron dopant is introduced into SiC by ion implantation before the heat treatment stage. The regions in which boron penetration is undesired can be protected by AlN and by an additional metal mask which is removed after the implantation.

However, annealing away the implantation induced structural disorder requires nearly the same as high temperatures as diffusion in case of p-type dopants in SiC and a considerable dopant diffusion happens to occur. This inevitably brings in contamination of the regions where acceptor penetration must be avoided in, for example, the central active area of a power rectifier diode, unless those regions are appropriately masked during the heat treatment. It is clear that in the present embodiment, the AlN mask functions similarly as it does in the case of conventional thermal diffusion, in protecting from boron diffusion during the annealing stage. Apart from the boron implantation stage, (the Al implantation having been omitted), all the steps are the same as in the first embodiment. Boron may be omitted from the load of the diffusion crucible it may as well be added to suppress its outdiffusion during heat treatment.

The invention is, of course, not in any way restricted to the embodiment described above, but several modifications thereof would be apparent to one skilled in the art without departing from the basic idea of the invention.

The method may be used for the production of any type of semiconductor device having a SiC layer. The definition of "SiC layer" is intended to include the SiC layer which may comprise several sub-layers as shown in the drawings. Furthermore, the definition layer is to be interpreted broadly and to comprise all types of volume extensions and shapes.

Although the first and second portion is defined as being singulars in the claims, each of these portions may comprise several separated sub-portions.

All definitions of the material of the different layers, of course, include inevitable impurities as well as intentional doping where SiC is concerned.

Boron has been found to be most suitable as the dopant for defining the guard rings, but diffusion of other dopants may be envisaged, such as for instance beryllium, which has a reasonably high diffusivity in SiC but is highly toxic.

We claim:

1. A method for producing a semiconductor device having a semiconductor layer of SiC, said method comprising the steps of
   a) applying a mask on at least a portion of said SiC layer to coat a first portion of said SiC layer leaving a second portion thereof uncoated,
   b) applying a heat treatment to said SiC layer,
   c) supplying dopants to the SiC layer during said heat treatment for diffusion of said dopants into the SiC layer at said second portion thereof for doping the SiC layer, and wherein said mask is made of a material selected from the group consisting of crystalline AlN as the only component and AlN as a major component of a crystalline alloy constituting said material.

2. A method according to claim 1, wherein said mask is made of crystalline AlN.

3. A method according to claim 1, wherein the mask applied on said layer portion before the heat treatment is made of a material having AlN as a major component of a crystalline alloy, which further comprises one or a combination of group 3B-nitrides and SiC.

4. A method according to claim 1, wherein said heat treatment is carried out at a temperature above 1500° C.

5. A method according to claim 1, wherein said dopants supplied for said diffusion are boron.

6. A method according to claim 1, for producing a semiconductor power device, wherein peripheral regions of the SiC layer are left uncoated by said mask for obtaining diffusion of dopants at the periphery thereof, and wherein the heat treatment and thereby the diffusion is carried out under such conditions that the dopants penetrate through a junction creating a space charge region of said device thereby for creating a guard ring arranged to smooth out the electric field in the peripheral regions during a blocking state of the power device.

7. A method according to claim 6, wherein said SiC layer is made of at least two sub-layers, a first uppermost layer of P-type and a second layer of N-type onto which the first uppermost layer is arranged.

8. A method according to claim 1, wherein a step of ion implantation is carried out in said second portion of said SiC layer not coated by said mask before said heat treatment is carried out, and wherein said heat treatment constitutes an annealing for re-crystallizing the ion-implanted layer of the SiC layer, said mask preventing occurring of impurity diffusion into areas covered thereby.

9. A method according to claim 1, wherein it comprises at least the following steps carried out in the following order:
   1) deposition of a mask material on the entire surface of the SiC layer, 2) patterning said mask material for producing said uncoated second portion of the SiC layer, 3) heat treatment of the SiC layer and 4) removal of the mask in a non-mechanical way.

10. A method according to claim 6, wherein said ion implantation is carried out in said peripheral regions of the SiC layer, wherein ions of the same conductivity type as the dopants to be diffused into the SiC layer are implanted creating a thin highly doped layer close to the surface of the SiC layer and then first an annealing heat treatment and then a heat treatment combined with a supply of dopants for guard ring formation is carried out, the diffusion for said guard ring formation being enhanced by the existence of said highly doped thin layer.

11. A method of doping a SiC layer comprising using a layer of a material having crystalline AlN as the only component or AlN as a major component of a crystalline alloy constituting said material as a mask preventing diffusion of impurities into areas coated by said mask when diffusing into said SiC layer in production of a semiconductor device having a semiconductor layer of said SiC.

12. A method of doping a SiC layer comprising using a layer of a material having crystalline AlN as the only component or AlN as a major component of a crystalline alloy constituting said material as a mask for preventing diffusion of impurities into SiC layer areas coated by said mask when annealing said SiC layer after ion implantation in production of a semiconductor device having a semiconductor layer of said SiC.

* * * * *